United States Patent [19]
Morimoto et al.

[11] Patent Number: 5,767,743
[45] Date of Patent: Jun. 16, 1998

[54] RADIO FREQUENCY POWER AMPLIFIER HAVING A TERTIARY HARMONIC WAVE FEEDBACK CIRCUIT

[75] Inventors: Shigeru Morimoto; Masahiro Maeda, both of Osaka, Japan

[73] Assignee: Matsushita Electric Industrial Co., Ltd., Kadoma, Japan

[21] Appl. No.: 728,438

[22] Filed: Oct. 10, 1996

[30] Foreign Application Priority Data

Oct. 13, 1995 [JP] Japan ................... 7-265219

[51] Int. Cl.$^6$ ................................................ H03F 1/34
[52] U.S. Cl. ..................... 330/294; 327/184; 330/85; 330/109; 330/251
[58] Field of Search ............................ 330/85, 107, 109, 330/207 A, 251, 294; 327/164, 184

[56] References Cited

FOREIGN PATENT DOCUMENTS

| 58-159002 | 9/1983 | Japan . |
|---|---|---|
| 6-196949 | 7/1994 | Japan . |
| 7231231 | 8/1995 | Japan . |

OTHER PUBLICATIONS

Sachihiro Toyoda, IEEE MTT-S Digest, 1993 "High Efficiency Single and Push-Pull Power Amplifiers", pp. 277–280.

David M. Snider, IEEE Transactions on Electron Devices, vol. ED.-14, No. 12, Dec. 1967, "A Theoretical Analysis and Experimental Confirmation of the Optimally Loaded and Overdriven RF Power Amplifier", pp. 851–857.

U.S. Application Serial No. 08/436,142 in the name of M. Maeda et al., filed on May 8, 1995.

*Primary Examiner*—James B. Mullins
*Attorney, Agent, or Firm*—Renner, Otto, Boisselle & Sklar, P.L.L.

[57] ABSTRACT

An RF power amplifier includes an input-side tertiary harmonic wave control circuit and an output-side tertiary harmonic wave control circuit, respectively connected to a gate and a drain of a signal amplification FET. The RF power amplifier also includes a tertiary harmonic wave feedback circuit connected in parallel with the signal amplification FET. The tertiary harmonic wave feedback circuit includes an input-side tertiary harmonic wave bandpass filter, a tertiary harmonic wave amplification FET, a phase shifter and an output-side tertiary harmonic wave bandpass filter. These circuit elements are connected in series. Due to such a configuration, a voltage waveform and a current waveform each having a nearly rectangular shape can be easily generated at an output terminal (a drain) of the signal amplification FET, not only in the region around the efficiency saturation point whore the FET operates in a non-linear mode, but also in other linear-operation regions. Thus, the RF power amplifier can operate with improved efficiency.

10 Claims, 7 Drawing Sheets

Z: Consumed power=0

Z': Consumed power≠0

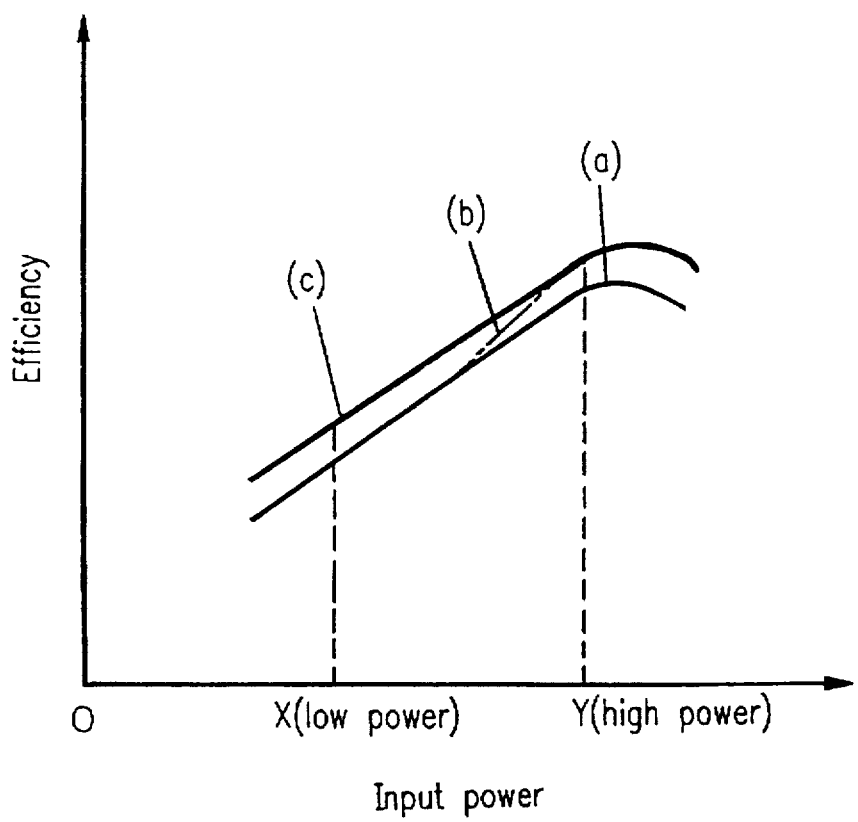
FIG. 8
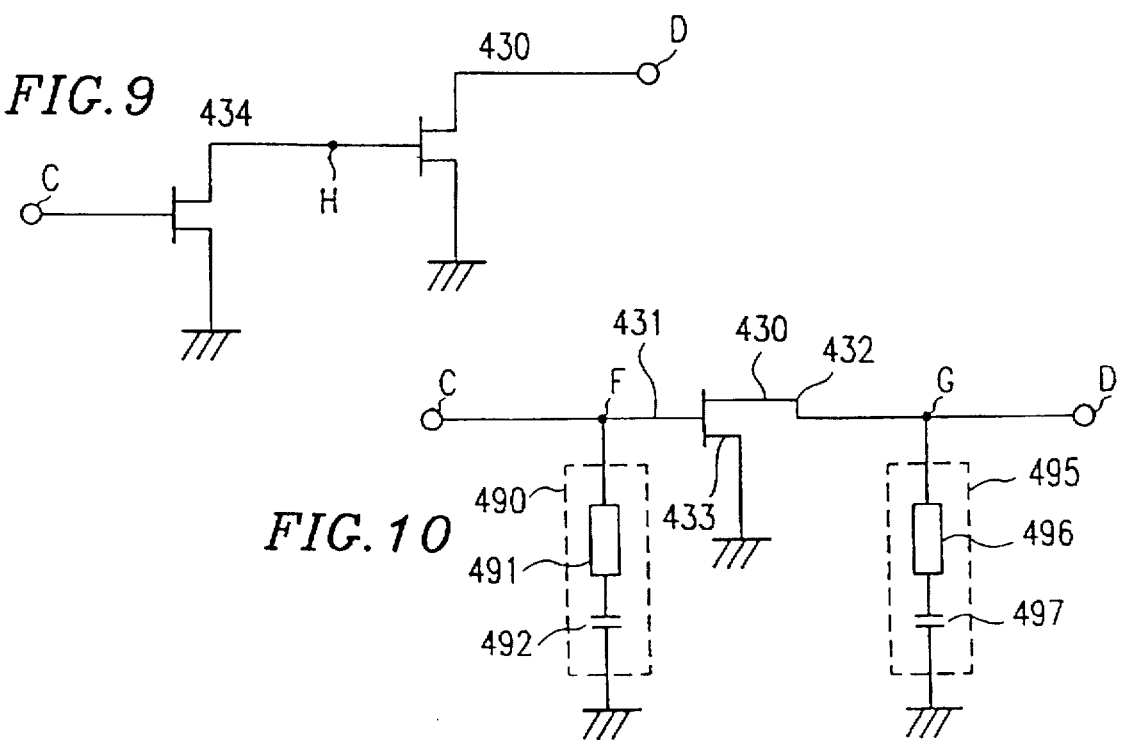
FIG. 9
FIG. 10

RADIO FREQUENCY POWER AMPLIFIER HAVING A TERTIARY HARMONIC WAVE FEEDBACK CIRCUIT

BACKGROUND OF THE INVENTION

1. Field of the Invention

The present invention relates to a radio frequency (hereinafter, referred to as simply "RF") power amplifier for obtaining RF power using a semiconductor device, which is mainly used for a transmitting circuit section of a communication apparatus and the like which utilizes a microwave band.

2. Description of the Related Art

Since various types of communication apparatuses, such as a portable telephone, have become widely used in recent years, there is an increasing demand for an RF power amplifier in a microwave band. The length of "talk time", i.e., time period during which a user of such a communication apparatus is allowed to talk, considerably depends on the performance of an RF power amplifier used for a transmitting circuit section of the communication apparatus. Therefore, an RF power amplifier is required to operate with a higher efficiency.

Concerning the circuit design of an RF power amplifier using a semiconductor active device such as transistors, the following has been reported. When the output circuit is designed in view not only of a frequency of a fundamental wave (hereinafter, also referred to as "fundamental wave frequency") but also of frequencies of harmonic waves (hereinafter, also referred to as "harmonic wave frequencies"), the RF power amplifier operates with a higher efficiency as compared with the case where the output circuit is designed in view of the fundamental wave frequency alone. For example, "A Theoretical Analysis and Experimental Confirmation of the Optimally Loaded and Overdriven RF Power Amplifier" written by David M. Snider, IEEE Trans. on Electron Devices, Vol. ED-14, No.12, pp. 851–857 (Dec. 1967), describes the optimum efficiency conditions for realizing 100% efficiency in converting DC power into RF power. The conditions include making impedances zero for harmonic wave components having a frequency obtained by multiplying the fundamental wave frequency by an even number and making impedances infinite for harmonic wave components having a frequency obtained by multiplying the fundamental wave frequency by an odd number, in addition to obtaining the impedance matching at the fundamental wave frequency at an output end of a semiconductor active element (a transistor) included in an RF power amplifier. Furthermore, Japanese Laid-Open Patent Publication No. 58-159002 discloses a specific circuit configuration for satisfying the above optimum efficiency conditions.

FIG. 1 is a circuit diagram of a basic RF power amplifier 100.

The RF power amplifier 100 includes a signal amplification field-effect transistor (hereinafter referred to as "FET") 130, an input-side impedance matching circuit 140 connected to the input side of the signal amplification FET 130, and an output-side impedance matching circuit 150 connected to the output side of the signal amplification FET 130. These circuit elements are provided between an input RF terminal 121 and an output RF terminal 124. The input-side impedance matching circuit 140 includes an input-side impedance matching line 141 and an input-side impedance matching capacitor 142. The input-side impedance matching circuit 140 matches the impedance for the fundamental wave component of an external circuit connected to the input RF terminal 121 to the internal impedance of the signal amplification FET 130. Similarly, the output-side impedance matching circuit 150 includes an output-side impedance matching line 151 and an output-side impedance matching capacitor 152. The output-side impedance matching circuit 150 matches the impedance for the fundamental wave component of the external circuit connected to the output RF terminal 124 to the internal impedance of the signal amplification FET 130.

Specifically, a gate 131 of the signal amplification FET 130 is connected to the input RF terminal 121 via a DC blocking capacitor 101 and the input-side impedance matching line 141 of the input-side impedance matching circuit 140. The input-side impedance matching line 141 is connected to a gate bias voltage supplying terminal 122 via a resistance 102 and is grounded via the input-side impedance matching capacitor 142.

Similarly, a drain 132 of the signal amplification FET 130 is connected to the output RF terminal 124 via a DC blocking capacitor 104 and the output-side impedance matching line 151 of the output-side impedance matching circuit 150. The input-side impedance matching line 151 is connected to a drain bias voltage supplying terminal 123 via a choke coil 103 and is grounded via the output-side impedance matching capacitor 152.

A source 133 of the signal amplification FET 130 is grounded.

An RF signal input to the RF power amplifier 100 having the above-described configuration through the input RF terminal 121 is transmitted to the signal amplification FET 130 via the input-side impedance matching circuit 140 and amplified by the FET 130. The amplified signal is then output through the output RF terminal 124 via the output-side impedance matching circuit 150.

FIG. 2 is a circuit diagram showing an RF power semiconductor amplifier 200 disclosed in Japanese Laid-Open Patent Publication No. 58-159002.

The RF power amplifier 200 of FIG. 2 includes a secondary harmonic wave control circuit 260 connected between the ground level and point A of a line connected to a drain 232 of a signal amplification FET 230. Other portions of the configuration of the RF power amplifier 200 are the same as that of the RF power amplifier 100 shown in FIG. 1 and therefore will not further be described. In FIG. 2, each circuit element is numbered with a reference numeral obtained by adding 100 to the reference numeral of the corresponding circuit element in FIG. 1. For example, a DC blocking capacitor, whose reference numeral in FIG. 1 is "101", is numbered with a reference numeral "201" in FIG. 2.

The secondary harmonic wave control circuit 260 includes a secondary harmonic wave control line 261 and a secondary harmonic wave control capacitor 262. The drain 232 of the signal amplification FET 230 is grounded via the line 261 and the capacitor 262. The line 261 and the capacitor 262 of the secondary harmonic wave control circuit 260 are so adjusted that the impedance becomes zero for the secondary harmonic wave component when the secondary harmonic wave control circuit 260 is viewed from point A.

The operation of the RF power amplifier 200 is basically the same as that of the RF power amplifier 100. However, in the RF power amplifier 200, generation of secondary harmonic wave component at point A is depressed since the impedance is zero for the secondary harmonic wave component when the secondary harmonic wave control circuit 260 is viewed from point A.

On the other hand, by using a rectangular wave as an input signal, the RF power amplifier can operate with a high efficiency. For example, Japanese Laid-Open Patent Publication No. 7-231231 discloses an RF power amplifier having a circuit configuration where an input signal having a nearly rectangular waveform can be supplied. FIG. 3 schematically shows a circuit configuration of an RF power amplifier 300 disclosed in this publication.

The RF power amplifier 300 includes a rectangular wave generation circuit 310 for generating a rectangular wave using an input signal 301 supplied through an RF input terminal 311 and a power amplification circuit 350 for amplifying the thus generated rectangular wave and supplying the amplified signal to an RF output terminal 312. The circuits 310 and 350 are connected to each other in series.

The rectangular wave generation circuit 310 includes a tertiary harmonic wave adjustment circuit 320 and a fundamental wave adjustment circuit 330 which are connected to each other in parallel. The circuits 320 and 330 are each connected to a signal synthesis circuit 340. The tertiary harmonic wave adjustment circuit 320 includes a tertiary harmonic wave bandpass filter 321, a tertiary harmonic wave amplification element 322, a phase shifter 323 and a capacitor 324. On the other hand, the fundamental wave adjustment circuit 330 includes a fundamental wave bandpass filter 331 and a capacitor 332. In the signal synthesis circuit 340, a gate bias resistance 341, a drain bias choke coil 345 and a dual gate FET 342 having two gates 343 and 344 are connected between a gate bias terminal 314 and a drain bias terminal 313.

The power amplification circuit 350 includes, as well as a capacitor 351, a gate bias resistance 352, a power amplification element 353 and a drain bias choke coil 354 connected between a drain bias terminal 315 and a gate bias terminal 316.

The signal 301 input to the RF power amplifier 300 through the RF input terminal 311 is first transmitted to the rectangular wave generation circuit 310, where a fundamental wave component 303 and a tertiary harmonic wave component 302 are taken out of the input signal 301. Only the tertiary harmonic wave component 302 of the input signal 301 is selectively transmitted through the tertiary harmonic wave adjustment circuit 320 due to the tertiary harmonic wave bandpass filter 321 included therein. The tertiary harmonic wave component 302 is then amplified in the tertiary harmonic wave amplification element 322, and the phase thereof is adjusted by the phase shifter 323. Then, the tertiary harmonic wave component 302 is input to the dual gate FET 342 through the gate 343.

On the other hand, only the fundamental wave component 303 of the input signal 301 is selectively transmitted through the fundamental wave adjustment circuit 330 due to the fundamental wave bandpass filter 331 included therein. The fundamental wave component 303 is input to the dual gate FET 342 through the other gate 344.

The tertiary harmonic wave component 302 and the fundamental wave component 303 thus input to the dual gate FET 342 are synthesized with each other into a synthesized waveform signal 304 having a nearly rectangular waveform and is output to the power amplification circuit 350. The synthesized waveform signal 304 is input to and amplified in the power amplification element 353 of the power amplification circuit 350 and is output through the RF output terminal 312.

The above-explained conventional RF power amplifiers have the following disadvantages.

In the RF power amplifier 200 disclosed in Japanese Laid-open Patent Publication No. 58-159002, the operational efficiency is improved especially in the region around the efficiency saturation point where harmonic wave components of a high amplitude are likely to be generated because of the non-linear operation. However, in other regions, the operational efficiency is not improved to a satisfactory level, although a good linearity of the operations is obtainable in those regions.

In accordance with the RF power amplifier 300 disclosed in Japanese Laid-Open Patent Publication No. 7-231231, the tertiary harmonic wave component 302 in taken out of the input signal 301 provided to the RF power amplifier 300 and is then amplified in the tertiary harmonic wave amplification element 322. Thereafter, the amplified tertiary harmonic wave component 302 is added to the fundamental wave component 303 contained in the input signal 301. Thus, the rectangular wave (synthesized waveform signal) 304 is obtained, which is to be supplied to the power amplification element 353 of the power amplification circuit 350.

However, in general, an input signal provided to an RF power amplifier used in an ordinary communication apparatus practically contains only a vary small amount of a tertiary harmonic wave component. Therefore, in order to obtain a sufficient amplitude level for the amplified tertiary harmonic wave component which is required to realize a desired operation by amplifying the tertiary harmonic wave component of such a small amount, a number of the tertiary harmonic wave amplification elements 322 must be connected in multiple stages in the tertiary harmonic wave adjustment circuit 320 of the RF power amplifier 300. This not only leads to an undesirable increase in the area occupied by the entire circuit, but also deteriorates the overall efficiency of the RF power amplifier 300 due to the increased amount of power consumed by the tertiary harmonic wave amplification elements 322.

Moreover, In accordance with the RF power amplifier 300, the fundamental wave component 303 and the tertiary harmonic wave component 302 must he taken out of the input signal 301 and synthesized back together to obtain the rectangular wave 304 to be supplied to the power amplification element 353. The circuit elements required for these processes also increase the area occupied by the entire circuit.

SUMMARY OF THE INVENTION

A radio frequency amplifier of the present invention includes: a power amplification circuit including a power amplification element; and a tertiary harmonic wave feedback circuit connected in parallel with the power amplification circuit. The tertiary harmonic wave feedback circuit feeds back a portion of a tertiary harmonic wave component contained in an amplified signal, which is output from an output aide of the power amplification circuit, to an input side of the power amplification circuit.

According to another aspect of the present invention, a radio frequency amplifier includes: a power amplification circuit including a plurality of power amplification elements connected in series in multiple stages; and a tertiary harmonic wave feedback circuit connecting an output side of the power amplification circuit to an input side of one of the power amplification elements in a selected stage. The tertiary harmonic wave feedback circuit feeds back a portion of a tertiary harmonic wave component contained in an amplified signal, which is output from the output side of the power amplification circuit, to the input side of the power amplification element in the selected stage.

Preferably, the tertiary harmonic wave feedback circuit comprises a tertiary harmonic wave bandpass filter and a phase shifter.

Preferably, the tertiary harmonic wave feedback circuit comprises at least one tertiary harmonic wave amplification active element.

Preferably, the radio frequency amplifier further includes a circuit, connected to at least one of the input side and the output side of the power amplification circuit, for controlling an impedance for a secondary harmonic wave component.

Preferably, the radio frequency amplifier further includes a circuit, connected to at least one of the input side and the output side of the power amplification circuit, for controlling an impedance for a tertiary harmonic wave component.

Thus, the invention described herein makes possible the advantage of providing an RF power amplifier which easily exhibits an improved efficiency even in regions other than the region around the efficiency saturation point without undesirably increasing the area occupied by the entire circuit or the amount of power consumed.

This and other advantages of the present invention will become apparent to those skilled in the art upon reading and understanding the following detailed description with reference to the accompanying figures.

BRIEF DESCRIPTION OF THE DRAWINGS

FIG. 8 is a diagram illustrating input power dependence of operational efficiency of the RF power amplifier shown in FIG. 4.

FIG. 9 is a circuit diagram which is obtained by modifying the RF power amplifier shown in FIG. 4.

FIG. 10 is another circuit diagram which is obtained by modifying the RF power amplifier shown in FIG. 4 in a different way.

DESCRIPTION OF THE PREFERRED EMBODIMENTS

Hereinafter, the present invention will be described by way of illustrative examples with reference to the accompanying figures.

Figure 4:
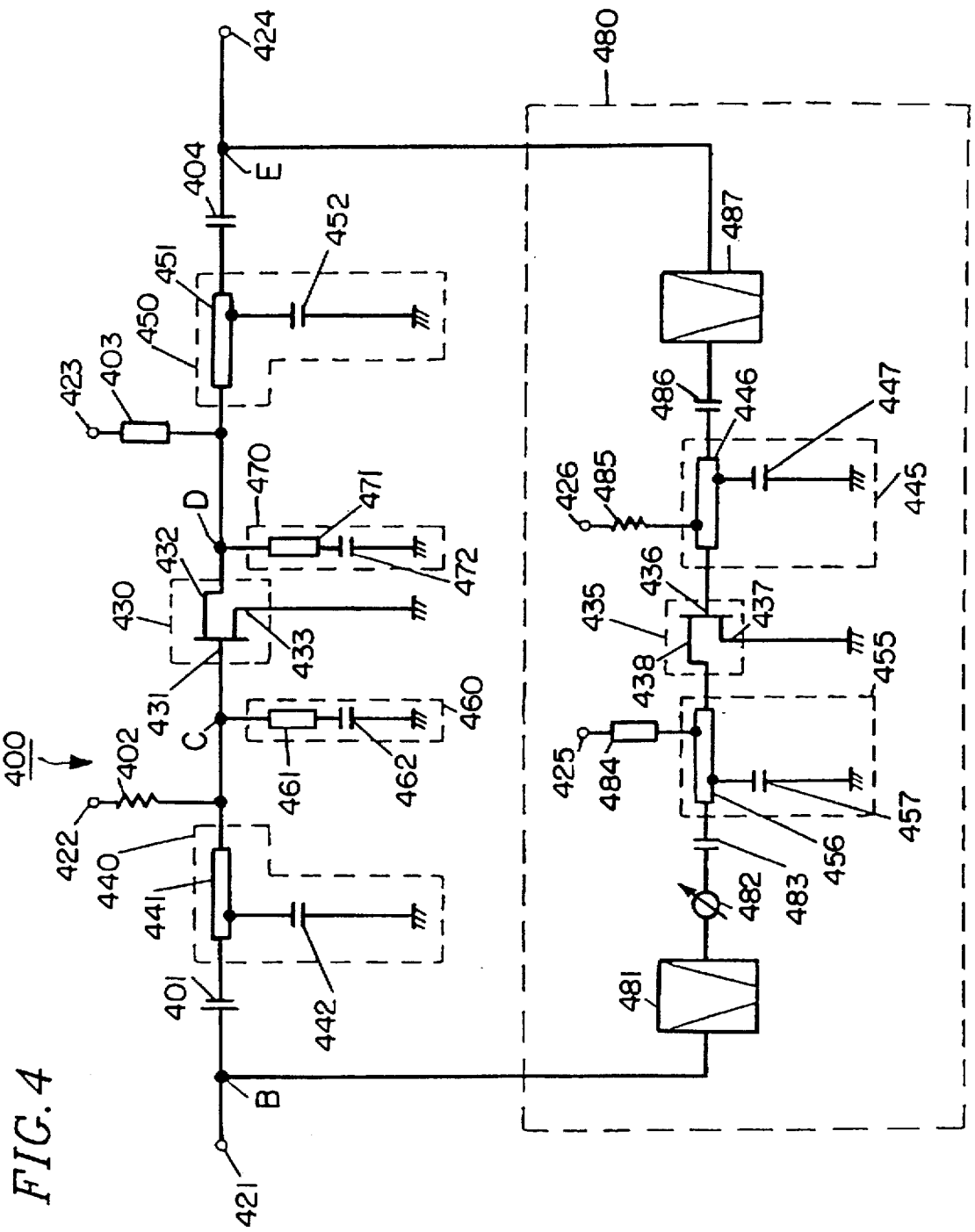
FIG. 4 is a circuit diagram of an RF power amplifier according to an example of the present invention.

FIG. 4 is a circuit diagram of an RF power amplifier 400 according to an example of the present invention.

The RF power amplifier 400 includes a signal amplification FET 430, an input-side impedance matching circuit 440 connected to the input side of the signal amplification FET 430 and an output-side impedance matching circuit 450 connected to the output side of the signal amplification FET 430. These circuit elements are provided between an input RF terminal 421 and an output RF terminal 424. Moreover, a tertiary harmonic wave feedback circuit 480 is connected between the input RF terminal 421 and the output RF terminal 424 in parallel with the signal amplification FET 430.

The input-side impedance matching circuit 440 includes an input-side impedance matching line 441 and an input-side impedance matching capacitor 442. The input-side impedance matching circuit 440 matches the impedance for the fundamental wave component of an external circuit connected to the input RF terminal 421 to the internal impedance of the signal amplification FET 430. Similarly, the output-side impedance matching circuit 450 includes an output-side impedance matching line 451 and an output-side impedance matching capacitor 452. The output-side impedance matching circuit 450 matches the impedance for the fundamental wave component of the external circuit connected to the output RF terminal 424 to the internal impedance of the signal amplification FET 430.

Specifically, a gate 431 of the signal amplification FET 430 is connected to the input RF terminal 421 via a DC blocking capacitor 401 and the input-side impedance matching line 441 of the input-side impedance matching circuit 440. The input-side impedance matching line 441 is connected to a gate bias voltage supplying terminal 422 via a resistance 402 and is grounded via the input-side impedance matching capacitor 442.

Similarly, a drain 432 of the signal amplification FET 430 is connected to the output RF terminal 424 via another DC blocking capacitor 404 and the output-side impedance matching line 451 of the output-side impedance matching circuit 450. The output-side impedance matching line 451 is connected to a drain bias voltage supplying terminal 423 via a choke coil 403 and is grounded via the output-side impedance matching capacitor 452.

A source 433 of the signal amplification FET 430 is grounded.

An input-side tertiary harmonic wave control circuit 460 is connected to point C of a line connected to the gate 431 of the signal amplification FET 430. On the other hand, an output-side tertiary harmonic wave control circuit 470 is connected to point D of a line connected to the drain 432 of the signal amplification FET 430.

The input-side tertiary harmonic wave control circuit 460 includes an input-side tertiary harmonic wave control line 461 and an input-side tertiary harmonic wave control capacitor 462. The gate 431 of the signal amplification FET 430 is grounded at point C via the line 461 and the capacitor 462. The line 461 and the capacitor 462 of the input-side tertiary harmonic wave control circuit 460 are so adjusted that the impedance becomes very high for the tertiary harmonic wave component when the input-side tertiary harmonic wave control circuit 460 is viewed from point C.

Similarly, the output-side tertiary harmonic wave control circuit 470 includes an output-side tertiary harmonic wave control line 471 and an output-side tertiary harmonic wave control capacitor 472. The drain 432 of the signal amplification FET 430 is grounded at point D via the line 471 and the capacitor 472. The line 471 and the capacitor 472 of the output-side tertiary harmonic wave control circuit 470 are so adjusted that the impedance becomes very high for the tertiary harmonic wave component when the output-side tertiary harmonic wave control circuit 470 is viewed from point D.

The tertiary harmonic wave feedback circuit 480 is connected in parallel with the signal amplification FET 430 between point E near the output RF terminal 424 and point B near the input RF terminal 421. The tertiary harmonic wave feedback circuit 480 included an input-side tertiary harmonic wave bandpass filter 487, a DC blocking capacitor 486, an input-side tertiary harmonic wave impedance matching circuit 445, a tertiary harmonic wave amplification FET 435, an output-side tertiary harmonic wave impedance matching circuit 455, another DC blocking capacitor 483, a phase shifter 482 and an output-side tertiary harmonic wave bandpass filter 481. The circuit elements included in the tertiary harmonic wave feedback circuit 480 are connected in series.

The input-side tertiary harmonic wave impedance matching circuit 445 includes an input-side tertiary harmonic wave impedance matching line 446 and an input-side tertiary harmonic wave impedance matching capacitor 447. The input-side tertiary harmonic wave impedance matching circuit 445 matches the impedance for the tertiary harmonic wave component of an external circuit connected to the output RF terminal 424 to the internal impedance of the tertiary harmonic wave amplification FET 435. Specifically, the input-side tertiary harmonic wave impedance matching line 446 is connected to an gate bias voltage supplying terminal 426 via a resistance 485 and is grounded via the input-side tertiary harmonic wave impedance matching capacitor 447.

Similarly, the output-side tertiary harmonic wave impedance matching circuit 455 includes an output-side tertiary harmonic wave impedance matching line 456 and an output-side tertiary harmonic wave impedance matching capacitor 457. The output-side tertiary harmonic wave impedance matching circuit 455 matches the impedance for the tertiary harmonic wave component of an external circuit connected to the input RF terminal 421 to the internal impedance of the tertiary harmonic wave amplification FET 435. Specifically, the output-side tertiary harmonic wave impedance matching line 456 is connected to a drain bias voltage supplying terminal 425 via a choke coil 484 and is grounded via the output-side tertiary harmonic wave impedance matching capacitor 457.

A gate 436 of the tertiary harmonic wave amplification FET 435 is connected to point E being the input section of the tertiary harmonic wave feedback circuit 480 via the input-side tertiary harmonic wave impedance matching line 446, the DC blocking capacitor 486 and the input-side tertiary harmonic wave bandpass filter 487. On the other hand, a drain 438 of the tertiary harmonic wave amplification FET 435 is connected to point B being the output section of the tertiary harmonic wave feedback circuit 480 via the output-side tertiary harmonic wave impedance matching line 456, the DC blocking capacitor 483, the phase shifter 482 and the output-side tertiary harmonic wave bandpass filter 481.

A source 437 of the tertiary harmonic wave amplification FET 435 is grounded.

Hereinafter, the operation of the RF power amplifier 400 having the above-described configuration will be described.

An RF signal input to the RF power amplifier 400 through the input RF terminal 421 is transmitted to the signal amplification FET 430 via the input-side impedance matching circuit 440 and amplified therein. A harmonic wave component is generated in this amplification process while the signal is amplified. Herein, the impedance is very high for the tertiary harmonic wave component when the input-side tertiary harmonic wave control circuit 460 is viewed from point C. The impedance is also very high for the tertiary harmonic wave component when the output-side tertiary harmonic wave control circuit 470 is viewed from point D. Therefore, a tertiary harmonic wave component having a large amplitude is generated at each of points C and D.

A portion of the tertiary harmonic wave component thus generated by the signal amplification FET 430 is input to the tertiary harmonic wave feedback circuit 480 via point E. The tertiary harmonic wave component is then input to the tertiary harmonic wave amplification FET 435 via the input-side tertiary harmonic wave band pass filter 487, the DC blocking capacitor 486 and the input-side tertiary harmonic wave impedance matching circuit 445. Herein, the input-side tertiary harmonic wave bandpass filter 487 prevents the fundamental wave component, which would lower the gain of the RF power amplifier 400, and unnecessary tertiary harmonic wave components from entering the tertiary harmonic wave feedback circuit 480.

The amplified tertiary harmonic wave component is output from the tertiary harmonic wave amplification FET 435 and fed back to point B being the input section of the signal amplification FET 430 via the output-side tertiary harmonic wave impedance matching circuit 455, the DC blocking capacitor 483, the phase shifter 482 and the output-side tertiary harmonic wave bandpass filter 481. The output-side tertiary harmonic wave bandpass filter 481 prevents the fundamental wave component from entering the tertiary harmonic wave feedback circuit 480 via point B to lower the gain of the RF power amplifier 400.

Figure 5:
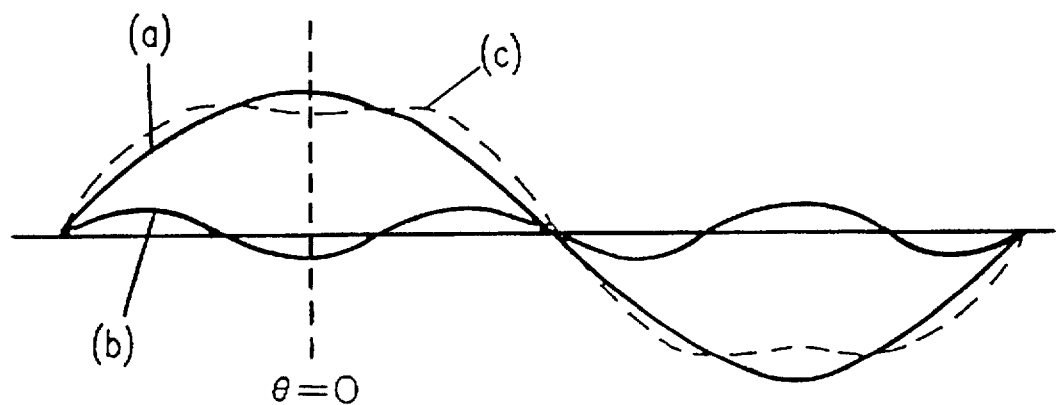
FIG. 5 is a diagram illustrating voltage waveforms at a drain of a signal amplification FET of the RF power amplifier shown in FIG. 4.

The tertiary harmonic wave component fed back to point B is output from the signal amplification FET 430 through the drain 432. FIG. 5 schematically shows voltage waveforms of the respective components at the drain 432. Specifically, it shows each of the waveforms of the fundamental wave component (a), the tertiary harmonic wave component (b), and a synthesized wave (c) obtained by synthesizing the two components (a) and (b). In FIG. 5, the horizontal axis represents the lapse of time, and the vertical axis represents the voltage intensity.

The amount by which the phase of the tertiary harmonic wave component is rotated by the phase shifter 482 can be adjusted so that, as shown in FIG. 5, the phase of the tertiary harmonic wave component (b) is substantially inverted, i.e., rotated by about 180°, with respect to the phase of the fundamental wave component (a) at θ-0. Moreover, the rate at which the tertiary harmonic wave component is amplified by the tertiary harmonic wave amplification FET 435 can be adjusted so that the amplitude of the tertiary harmonic wave component (b) is set to an appropriate level with respect to the amplitude of the fundamental wave component (a), whereby the waveform of the synthesized wave (c) becomes more ideally rectangular. In the example of the FIG. 5, the amplitude of the tertiary harmonic wave component (b) is adjusted to be about ⅙ to about ⅐ of the amplitude of the fundamental wave component (a).

Figure 6:
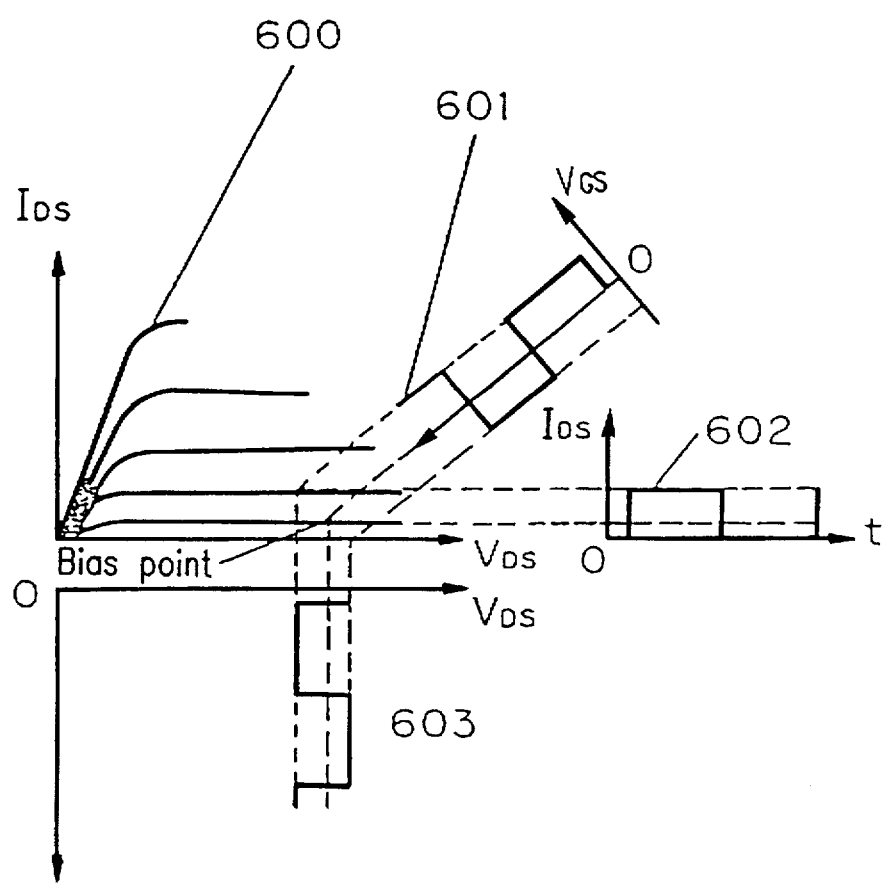
FIG. 6 is a diagram illustrating the operation of the signal amplification FET of the RF power amplifier shown in FIG. 4 in the case where a small power signal is input.

FIG. 6 shows an output current waveform 602 and an output voltage waveform 603 at the drain 432 of the signal amplification FET 430 of the RF power amplifier 400 (i.e., waveforms of a current $I_{DS}$ and voltage $V_{DC}$ between the drain 432 and the source 433), in the case where an input power is of a relatively small signal. In the description below, for simplicity, it is assumed that an input voltage waveform 601 to the signal amplification FET 430 is rectangular. It is also assumed that the signal amplification FET 430 is subject to an AB class operation.

In a graph showing static characteristics 600 of the signal amplification FET 430 in FIG. 6, the vertical axis represents the drain-source current ($I_{DS}$) , and the horizontal axis represents the drain-source voltage ($V_{DS}$). In a graph of the input voltage waveform 601 provided between the gate and the source, the vertical axis represents a gate-source input voltage ($V_{DS}$), and the horizontal axis represents the lapse of time.

When the input voltage 601 having a rectangular waveform is input between the gate 431 and the source 433, the output voltage waveform 603 and the output current waveform 602, which are observed between the drain 432 and the source 433, both become rectangular. In this case, the phase of the output voltage waveform 603 and the phase of the output current waveform 602 are shifted from each other by about 180°.

In practice, the amplification rate of the signal amplification FET 430 for the fundamental wave component differs from that for the tertiary harmonic wave component. Therefore, even when the input voltage 601 having a rectangular waveform is input to the signal amplification FET 430 through the gate 431, the output current waveform 602 and the output voltage waveform 603 obtained at the drain 432 do not have a completely rectangular shape. In order to obtain the output current waveform 602 and the output voltage waveform 603 having more ideally rectangular shapes at the drain 432, it is desirable to optimize the amplification rate of the tertiary harmonic wave amplification FET 435 and the amount of phase rotation of the phase shifter 482 for the tertiary harmonic wave component, with the current waveform 602 and the voltage waveform 603 at the drain 432 of the signal amplification FET 430 being observed.

Figure 7A:
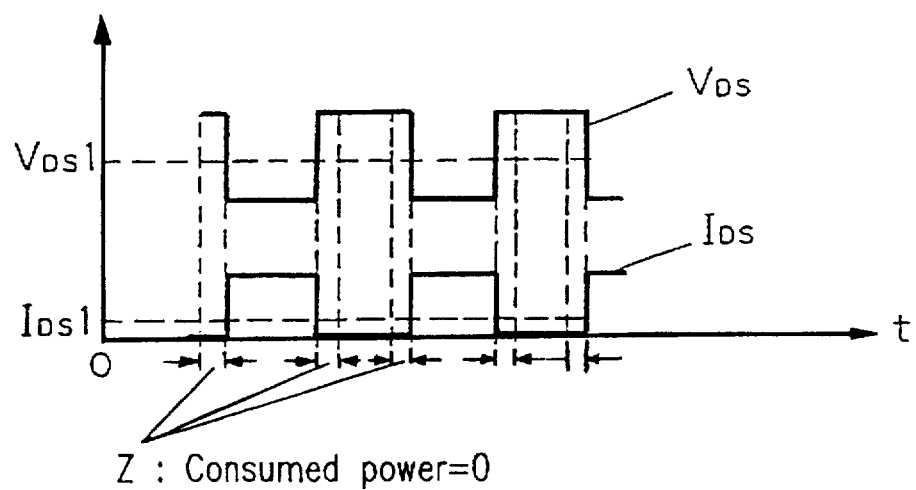
FIG. 7A is a diagram illustrating a voltage waveform and a current waveform at the drain of the signal amplification FET of the RF power amplifier shown in FIG. 4 in the case where a small power signal is input.
Figure 7B:
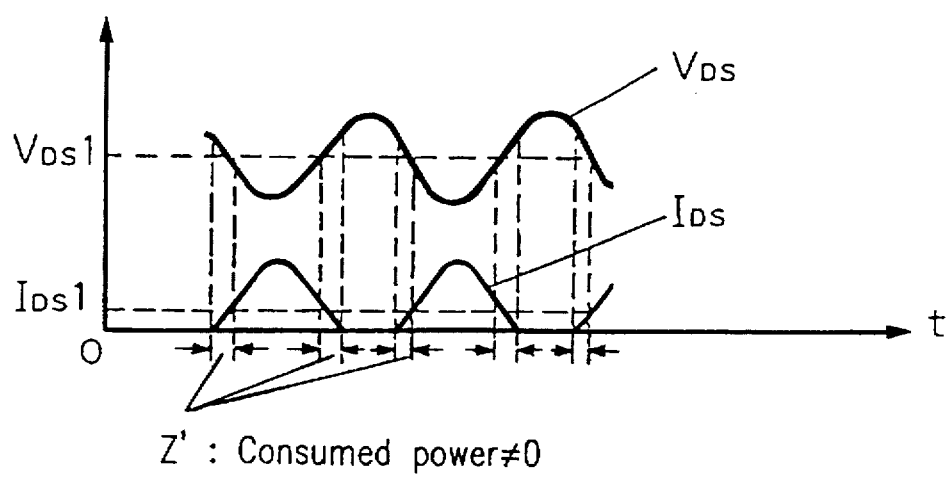
FIG. 7B is a diagram illustrating a voltage waveform and a current waveform at a drain of a signal amplification FET of the conventional RF power amplifier shown in FIG. 2 in the case where a small power signal is input.

FIGS. 7A and 7B show, in a manner different from that of FIG. 6, the output current waveform $I_{DS}$ and the output voltage waveform $V_{DS}$ at the drain 432 of the signal amplification FET 430 in the case where a small power input signal is provided. Specifically, FIG. 7A shows the output voltage waveform ($V_{DS}$) 603 and the output current waveform ($I_{DS}$) 602 obtained by the RF power amplifier 400 of the present invention, in which the waveforms 603 and 602 are arranged along the same time axis. For comparison with the present invention, FIG. 7B shows an output current waveform $I_{DS}$ and an output voltage waveform $V_{DS}$ at the drain 232 of the signal amplification FET 230 of the conventional RF power amplifier 200 described above with reference to FIG. 2.

As shown in FIG. 7A, in the RF power amplifier 400 of the present invention, there is no flow of the output current $I_{DS}$ during a period Z. Accordingly, the amount of power consumed during the period Z is zero. To the contrary, as shown in FIG. 7B, in the case of the conventional RF power amplifier 200, there is a flow of the output current $I_{DS}$ during a period Z' corresponding to the period Z in FIG. 7A. Accordingly, the amount of power consumed during the period Z' is not zero.

Thus, in the RF power amplifier 400 of the present invention, even when it is not possible to obtain a voltage and a current having a completely rectangular shape, it is possible to obtain an output voltage and an output current each having a nearly rectangular waveform even in the case where a small signal power is input. Therefore, it is possible to minimize the period during which both of a non-zero voltage and a non-zero current are output. As a result, only a reduced amount of DC power supplied from the drain is wasted, i.e., converted into heat and the like. Thus, the operational efficiency of the amplifier is improved.

Figure 1:
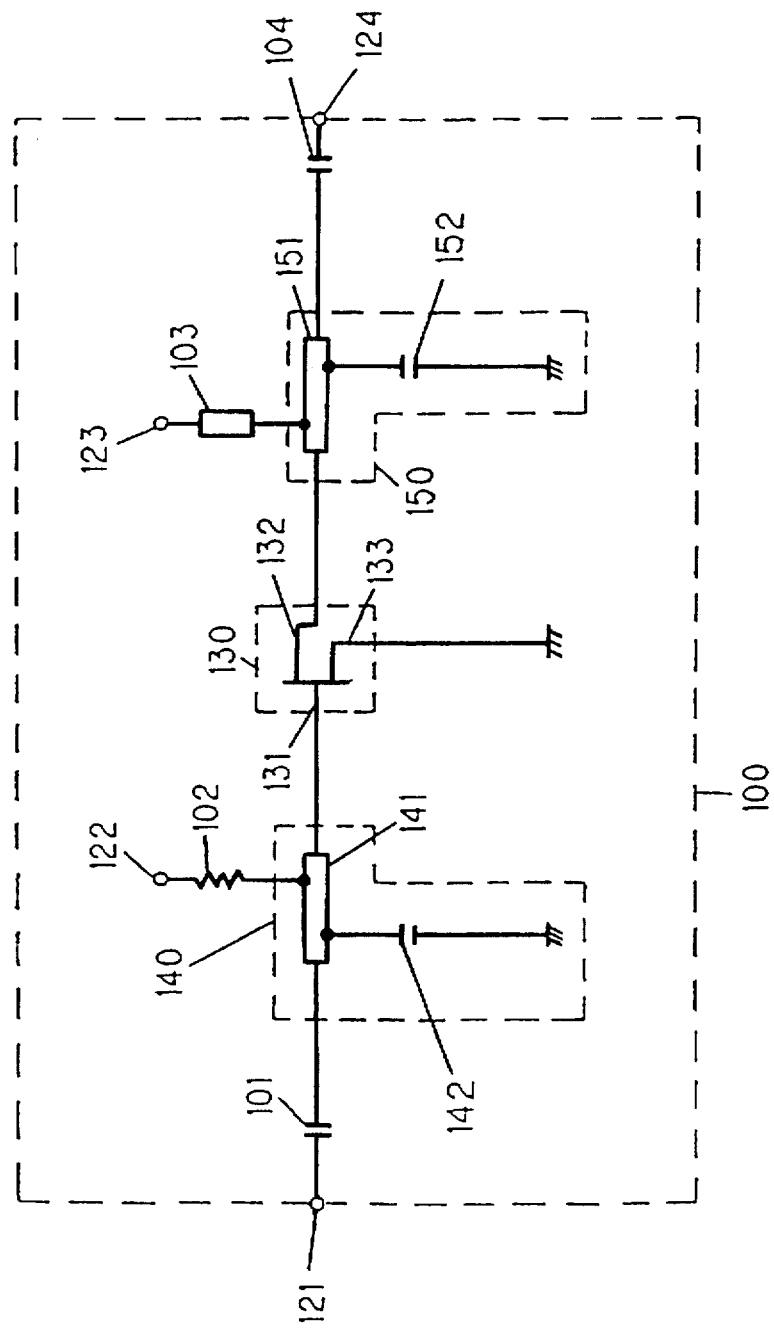
FIG. 1 is a circuit diagram of a conventional RF power amplifier.
Figure 2:
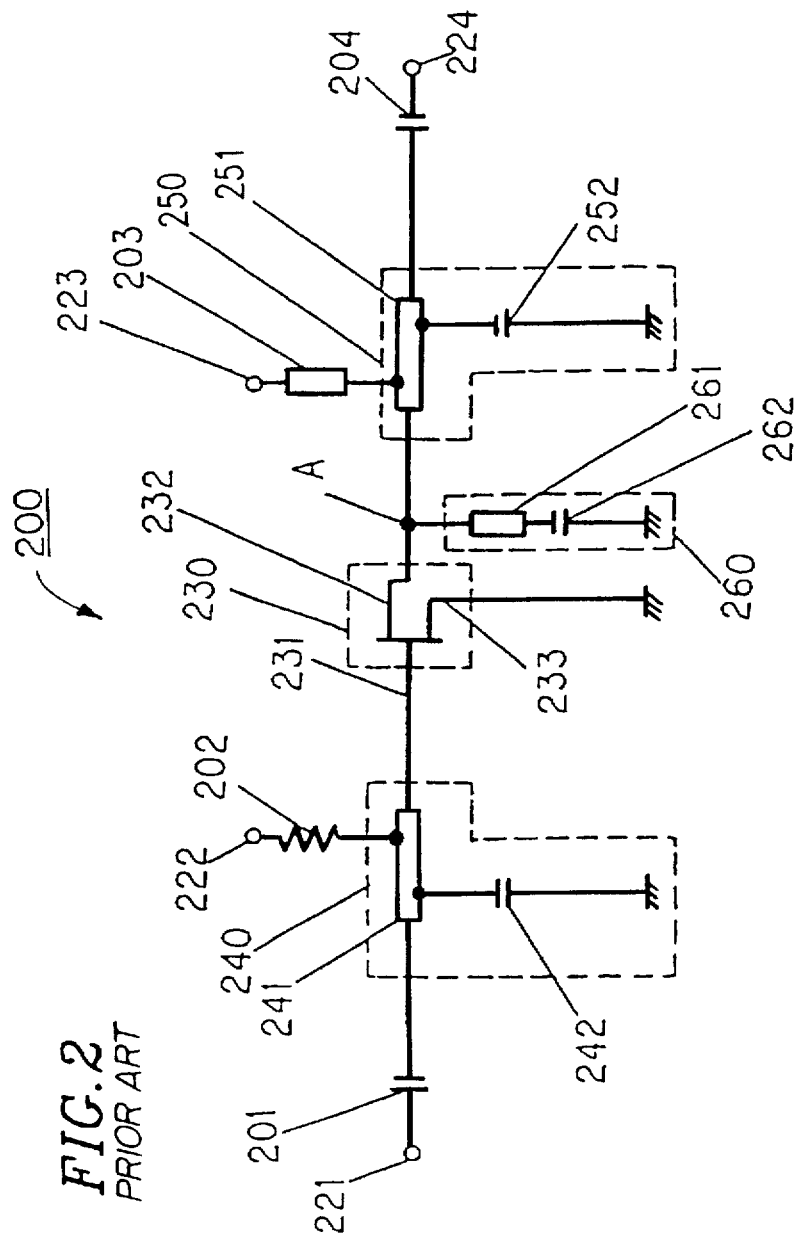
FIG. 2 is a circuit diagram of another conventional RF power amplifier.
Figure 3:
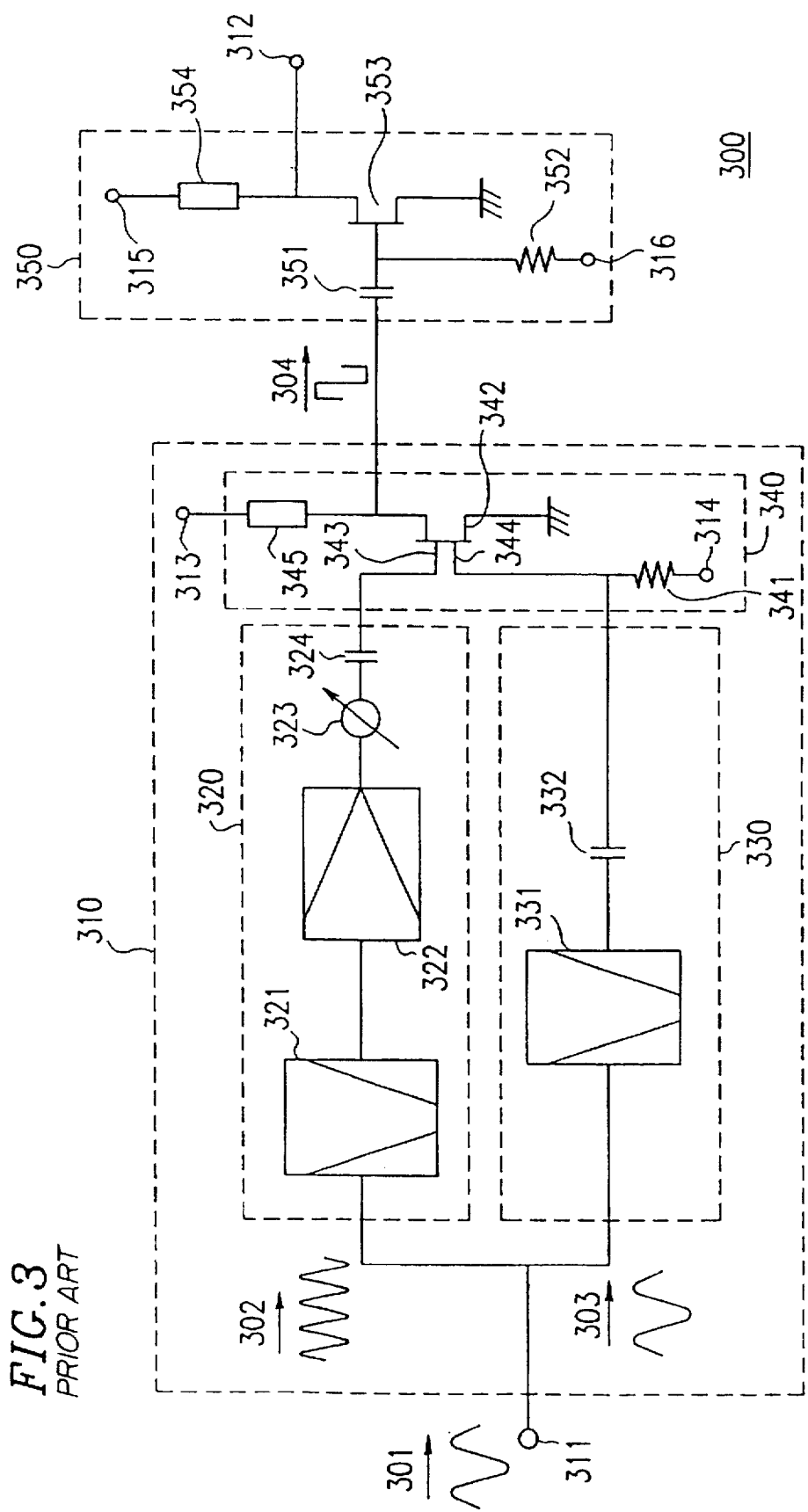
FIG. 3 is a circuit diagram of still another conventional RF power amplifier.

FIG. 8 shows input power dependence of the operational efficiency of each of the RF power amplifier 400 of the present invention, the conventional RF power amplifier 100 of FIG. 1 and the conventional RF power amplifier 200 of FIG. 2. The horizontal axis represents the input power, and the vertical axis represents the operational efficiency.

In the region around the efficiency saturation point, a relatively large power input (large signal input) Y is provided, and therefore a signal amplification FET operates in a non-linear mode. It is observed in FIG. 8 that, in this region, the conventional RF power amplifier 200 having the characteristic represented by line (b) operates with a higher efficiency as compared with the conventional RF power amplifier 100 having the characteristic represented by line (a). The reason for this is as follows. When the relatively large power input Y is supplied to the RF power amplifier 200, and the signal amplification FET 230 thereof thereby operates in the non-linear mode in the region around the efficiency saturation point, only generation of the secondary harmonic wave component is depressed due to the secondary harmonic wave control circuit 260.

In this region around the efficiency saturation point, the RF power amplifier 400 of the present invention having the characteristic represented by line (c) operates with an efficiency of the same level as that of the conventional RF power amplifier 200.

On the other hand, in regions where a relatively small power input (small signal input) X is provided, the RF power amplifier 400 of the present invention operates with a higher efficiency as compared with the conventional RF power amplifier 100 and 200, for reasons previously described.

As shown in FIG. 8, the RF power amplifier 400 of the present invention operates with a high efficiency in the region around the efficiency saturation point where the large signal input Y is provided. Moreover, even when operating in a linear region where the small signal input X is provided, the RF power amplifier 400 of the present invention is capable of easily generating a voltage and a current each having a nearly rectangular waveform at an output terminal of a power amplification element (e.g., a drain of an FET). Thus, the operational efficiency can be improved.

In the circuit configuration shown in FIG. 4, the tertiary harmonic wave feedback circuit 480 is connected between points B and E. Points B and E are respectively located at positions beyond the input-side tertiary harmonic wave control circuit 460 and beyond the output-side tertiary harmonic wave control circuit 470, as viewed from the signal amplification FET 430. Alternatively, a similar effect can be realized with points B and E being respectively located between the signal amplification FET 430 and the input-side tertiary harmonic wave control circuit 460; and between the signal amplification FET 430 and the output-side tertiary harmonic wave control circuit 470.

Furthermore, the above-described example of the present invention can be partially modified as shown in FIG. 9 and FIG. 10.

FIG. 9 shows a configuration obtained by modifying the section between points C and D, which includes the signal amplification FET 430, in the circuit configuration of the RF power amplifier 400 described above with reference to FIG. 4.

Specifically, another signal amplification FET 434 is connected to the signal amplification FET 430 in series in order to correspond to the case where an RF power amplifier is required to provide a higher gain.

In such a configuration, a tertiary harmonic wave component is fed back to the input side of the signal amplification FET 434 in the former stage but not to point H which corresponds to the input terminal of the signal amplification FET 430 in the latter stage. As a result, a rectangular wave is input to each of the signal amplification FETs 430 and 434. Thus, both of the signal amplification FETs 430 and 434 operate with high efficiency. Moreover, even in the case where the tertiary harmonic wave component fed back by the tertiary harmonic wave feedback circuit 480 shown in FIG. 4 does not have a sufficiently large amplitude, the amplitude of the tertiary harmonic wave component can be amplified by the signal amplification FET 434 in the former stage to an amplitude level required to shape the signal input to the signal amplification FET 430 in the letter stage into a sufficiently rectangular waveform.

It is also applicable to connect further signal amplification FETs in series in multiple stages.

FIG. 10 shows another configuration obtained by modifying the section between points C and D, which includes the signal amplification FET 430, in the circuit configuration of the RF power amplifier 400 described above with reference to FIG. 4.

Specifically, in the configuration shown in FIG. 10, an input-side secondary harmonic wave control circuit 490 is connected to point F of a line connected between the gate 431 of the signal amplification FET 430 and point C. Similarly, an output-side secondary harmonic wave control circuit 495 is connected to point G of a line connected between the drain 432 of the signal amplification FET 430 and point D.

The input-side secondary harmonic wave control circuit 490 includes a secondary harmonic wave control line 491 and a secondary harmonic wave control capacitor 492. The gate 431 to the signal amplification FET 430 is grounded via the line 491 and the capacitor 492. The line 491 and the capacitor 492 of the input-side secondary harmonic wave control circuit 490 are so adjusted that the impedance becomes very small or zero for the secondary harmonic wave component when the input-side secondary harmonic wave control circuit 490 is viewed from point F.

Similarly, the output-side secondary harmonic wave control circuit 495 includes a secondary harmonic wave control line 496 and a secondary harmonic wave control capacitor 497. The drain 432 of the signal amplification FET 430 is grounded via the line 496 and the capacitor 497. The line 496 and the capacitor 497 of the output-side secondary harmonic wave control circuit 495 are so adjusted that the impedance becomes very small or zero for the secondary harmonic wave component when the output-side secondary harmonic wave control circuit 495 is viewed from point G.

By providing the secondary harmonic wave control circuits 490 and 495 as described above, generation of the secondary harmonic wave component at points F and G is depressed, whereby it is possible to obtain a more ideally rectangular voltage waveform.

In the description above, the secondary harmonic wave control circuits 490 and 495 are respectively connected to points F and G corresponding to the input side and the output side, respectively, of the signal amplification FET 430. However, the generation of the secondary harmonic wave component can be depressed also in a configuration where a secondary harmonic wave control circuit is connected to either one of points F or G.

In the above description, the phrase "signal amplification" is used, such as "signal amplification FET". This phrase can be referred to as "power amplification" because a power of a signal is amplified in an actual situation.

As described above, in an RF power amplifier of the present invention, an amplified power is generated by a power amplification circuit including one power amplification element in a single stage or a plurality of power amplification elements connected in series in multiple stages. A portion of the tertiary harmonic wave component contained in the amplified power is fed back to the input section of the power amplification circuit by a tertiary harmonic wave feedback circuit and is synthesized with a fundamental wave component contained in an input signal.

An RF input signal supplied to the power amplification circuit is amplified by the power amplification element such as an FET. The amplified power output from the power amplification circuit contains a tertiary harmonic wave component generated in the amplification process. The tertiary harmonic wave component is taken out of the output signal from the power amplification circuit and is fed back to the input side of the power amplification circuit by the tertiary harmonic wave feedback circuit.

The tertiary harmonic wave component fed back to the input section of the power amplification circuit is synthesized with the fundamental wave component contained in the input signal. Due to this synthesis process, the voltage waveform of the input signal is shaped into a nearly rectangular waveform. According to the configuration of the present invention, the tertiary harmonic wave component generated by the power amplification element of the power amplification circuit is utilized for the above-described waveform shaping process for the waveform of the signal input to the power amplification circuit. Therefore, it is possible to very easily obtain a tertiary harmonic wave component of a large amplitude.

The power amplification circuit may include a plurality of the power amplification elements (e.g., the FETs) connected in series in multiple stages. In this case, the tertiary harmonic wave component can be fed back by the tertiary harmonic wave feedback circuit beyond a plurality of the power amplification elements over the multiple stages. This makes it possible to obtain a tertiary harmonic wave component of an even larger amplitude. Moreover, it becomes possible to improve the efficiency of the plurality of power amplification elements being in parallel with the tertiary harmonic wave feedback circuit.

Upon shaping the input signal waveform into a nearly rectangular waveform by synthesizing the fed back tertiary harmonic wave component with the fundamental wave component contained in the input signal, in order to obtain a more ideally rectangular waveform, it is preferable to adjust the phase and amplitude of the tertiary harmonic wave component to be fed back in accordance with the phase and amplitude of the fundamental wave component. By such an adjustment, it is also possible to improve the efficiency of the waveform shaping process. This can be realized by so configuring the tertiary harmonic wave feedback circuit that it includes a tertiary harmonic wave bandpass filter and a phase shifter. The tertiary harmonic wave bandpass filter selectively feeds back only the tertiary harmonic wave component and prevents unnecessary harmonic wave components and the fundamental wave component, which would lower the gain of the RF power amplifier, from entering the tertiary harmonic wave feedback circuit. The phase shifter, on the other hand, adjusts the phase of the tertiary harmonic wave component.

Moreover, in the case where at least one tertiary harmonic wave amplification element (e.g., an FET for amplifying tertiary harmonic wave component) is provided in the tertiary harmonic wave feedback circuit, it is possible to adjust the amplitude of the tertiary harmonic wave component to be fed back.

When the power amplification device operates in a non-linear mode, the amount of the tertiary harmonic wave component to be generated is small. In this case, a circuit for controlling an impedance for the tertiary harmonic wave component may be connected to at least one of the input side and the output side of the power amplification circuit. Thus, the impedance becomes high for the tertiary harmonic wave component, and the amplitude of the tertiary harmonic wave component can thereby be made large.

Moreover, a circuit for controlling an impedance for the secondary harmonic waves may be connected to at least one of the input side and the output side of the power amplification circuit. In this case, the impedance can be made low for the secondary harmonic wave components. Thus, it becomes possible to shape the waveform of the signal input to the power amplification circuit into a more ideally rectangular waveform.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A radio frequency amplifier, comprising:

a power amplification circuit including a power amplification element; and a tertiary harmonic wave feedback circuit connected in parallel with the power amplification circuit, wherein the tertiary harmonic wave feedback circuit feeds back a portion of a tertiary harmonic wave component contained in an amplified signal, which is output from an output side of the power amplification circuit, to an input side of the power amplification circuit.

2. A radio frequency amplifier according to claim 1, wherein the tertiary harmonic wave feedback circuit comprises a tertiary harmonic wave bandpass filter and a phase shifter.

3. A radio frequency amplifier according to claim 1, wherein the tertiary harmonic wave feedback circuit comprises at least one tertiary harmonic wave amplification active element.

4. A radio frequency amplifier according to claim 1, further comprising a circuit, connected to at least one of the input side and the output aide of the power amplification circuit, for controlling an impedance for the tertiary harmonic wave component.

5. A radio frequency amplifier according to claim 1, further comprising a circuit, connected to at least one of the input side and the output side of the power amplification circuit, for controlling an impedance for a secondary harmonic wave component.

6. A radio frequency amplifier, comprising:

a power amplification circuit including a plurality of power amplification elements connected in series in multiple stages; and a tertiary harmonic wave feedback circuit connecting an output side of the power amplification circuit to an input side of one of the power amplification elements in a selected stage, wherein the tertiary harmonic wave feedback circuit feeds back a portion of a tertiary harmonic wave component contained in an amplified signal, which is output from the output side of the power amplification circuit, to the input side of the power amplification element in the selected stage.

7. A radio frequency amplifier according to claim 6, wherein the tertiary harmonic wave feedback circuit comprises a tertiary harmonic wave bandpass filter and a phase shifter.

8. A radio frequency amplifier according to claim 6, wherein the tertiary harmonic wave feedback circuit comprises at least one tertiary harmonic wave amplification active element.

9. A radio frequency amplifier according to claim 6, further comprising a circuit, connected to at least one of the input side and the output side of the power amplification circuit, for controlling an impedance for the tertiary harmonic wave component.

10. A radio frequency amplifier according to claim 6, further comprising a circuit, connected to at least one of the input side and the output side of the power amplification circuit, for controlling an impedance for a secondary harmonic wave component.

\* \* \* \* \*

UNITED STATES PATENT AND TRADEMARK OFFICE
CERTIFICATE OF CORRECTION

PATENT NO. : 5,767,743
DATED : June 16, 1998
INVENTOR(S) : Shigeru Morimoto, et al.

It is certified that error appears in the above-identified patent and that said Letters Patent is hereby corrected as shown below:

On the title page item [73], should read--Matsushita Electronics Corporation, Takatsuki, Japan--

Signed and Sealed this

Fourth Day of January, 2000

Attest:

Attesting Officer

Acting Commissioner of Patents and Trademarks

UNITED STATES PATENT AND TRADEMARK OFFICE
CERTIFICATE OF CORRECTION

PATENT NO. : 5,767,743
DATED : June 16, 1998
INVENTOR(S) : Shigeru Morimoto, et. al.

It is certified that error appears in the above-identified patent and that said Letters Patent is hereby corrected as shown below:

Title page, item [57],

In the abstract, line 16, the term "whore" should read --where--

In column 4, line 14, "in" should read --is--.

In column 4, line 39, "In" should read --in--.

In column 4, line 41, "he should read --be--.

In column 8, line 53, "θ-0" should read --$\theta = 1$--.

Signed and Sealed this

Seventh Day of March, 2000

Attest:

Attesting Officer

Q. TODD DICKINSON

Commissioner of Patents and Trademarks